United States Patent [19]

Teuling

[11] Patent Number: 4,540,933
[45] Date of Patent: Sep. 10, 1985

[54] CIRCUIT FOR SIMULTANEOUS CUT-OFF OF TWO SERIES CONNECTED HIGH VOLTAGE POWER SWITCHES

[75] Inventor: Dirk J. A. Teuling, Eindhoven, Netherlands

[73] Assignee: U.S. Philips Corporation, New York, N.Y.

[21] Appl. No.: 546,264

[22] Filed: Oct. 28, 1983

[30] Foreign Application Priority Data

Nov. 10, 1982 [NL] Netherlands ............ 8204347

[51] Int. Cl.³ .............................. H03K 17/28
[52] U.S. Cl. ..................... 323/271; 315/411
[58] Field of Search ............. 307/113, 116, 130, 140, 307/141, 592; 315/411; 363/17, 98, 132, 134; 323/271, 289

[56] References Cited

U.S. PATENT DOCUMENTS 4,288,738 9/1981 Rogers et al. .................. 323/271
4,395,675 7/1983 Toumani ........................ 323/271

FOREIGN PATENT DOCUMENTS 0138210 2/1973 Netherlands.
2001510 1/1979 United Kingdom ............. 315/411

Primary Examiner—A. D. Pellinen
Assistant Examiner—Derek S. Jennings
Attorney, Agent, or Firm—Robert T. Mayer; Bernard Franzblau

[57] ABSTRACT

A circuit arrangement comprising at least two high-voltage power switches (e.g. transistors) connected in series to a high voltage source. In order to ensure that the switches are automatically cut off substantially simultaneously, the control means of each switch comprise a delay element for delaying the cut-off signal. A comparison stage controls the delay caused by at least one delay element as a function of the difference between the voltage present at the junction point of the switches and a reference voltage.

20 Claims, 3 Drawing Figures

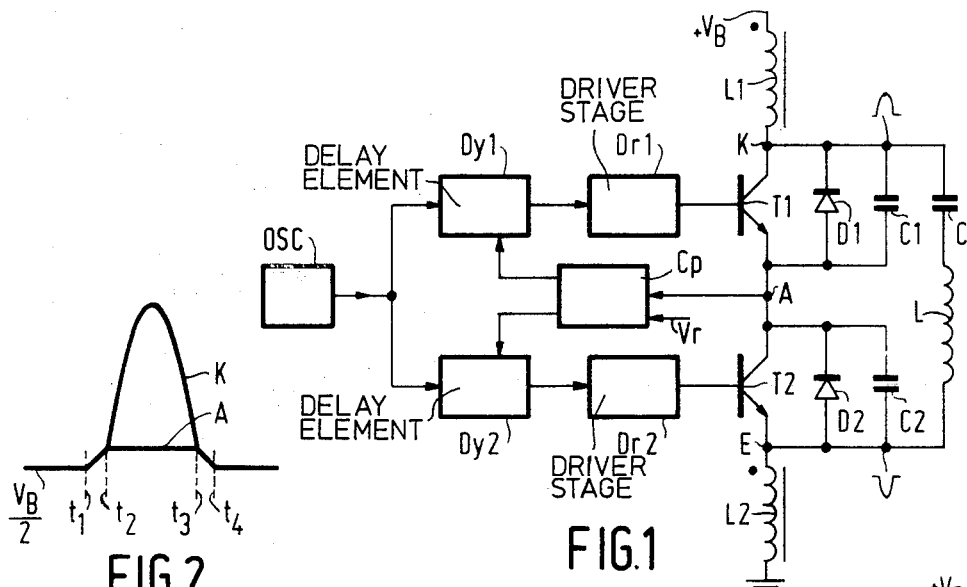
FIG.2
FIG.1
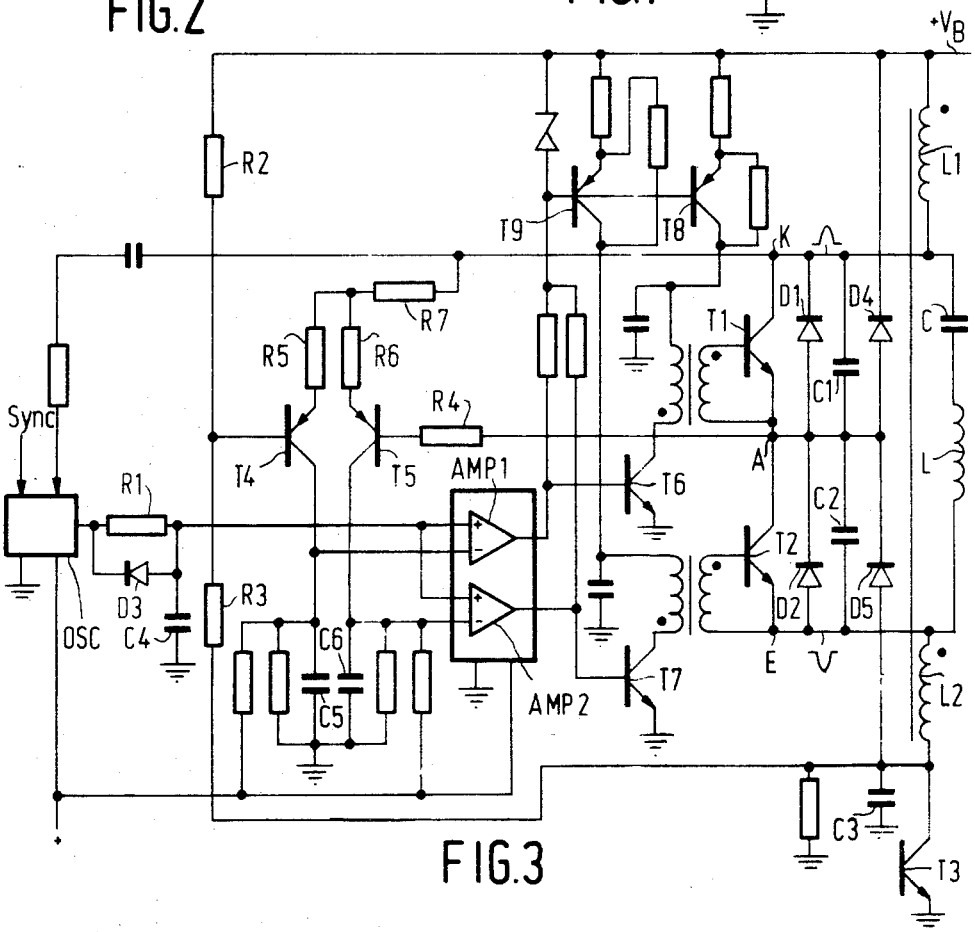
FIG.3

CIRCUIT FOR SIMULTANEOUS CUT-OFF OF TWO SERIES CONNECTED HIGH VOLTAGE POWER SWITCHES

BACKGROUND OF THE INVENTION

The invention relates to a circuit arrangement comprising at least two high-voltage power switches connected in series and having control means for repeatedly cutting off the switches. The control means are connected to a signal source for producing the control signal for the switches.

In such a circuit arrangement, which is generally known, a high voltage, which one switch alone is not capable of withstanding, is distributed over two or more switches. In this case the switches are controllable elements, for example, switching transistors, and it is necessary for these elements to be substantially simultaneously conducting and cut off. Switching on these elements is not very difficult because generally the switch-on time is very short. On the other hand, the switch-off time is comparatively long because the charge carriers stored during the preceding conduction time cannot be removed immediately, and the switch-off times of the various switches can be different. The differences, especially at high switching frequencies, are not negligible. Therefore, there is a risk that one switch may be still conducting while the other switch is already cut off, which, depending upon the circuit used, leads either to a non-uniform voltage distribution or to a current peak, as a result of which one or more of the switches can be damaged.

U.S. Pat. No. 3,631,314 discloses a circuit arrangement comprising one high-voltage power switch, which is switched off in a satisfactory manner in that its control lead comprises a delay element. This element consists of an inductor through which the control current for the switch, which is a power transistor, flows with a reduced rate of variation. Due to this current, the charge carriers leak away until the transistor comes out of saturation and is then cut off very rapidly, but a considerable time after the occurrence of the cut-off signal. When such switches are connected in a series arrangement to a high voltage, it would be obvious to provide the base lead of each switch with an adjustable inductor, the separate inductors being adjusted so that the transistors become non-conducting simultaneously. However, this process is time-consuming and moreover has to be repeated as the storage times of the charge carriers vary with time.

SUMMARY OF THE INVENTION

The invention has for an object to provide a circuit arrangement in which the cut-off instants of the switches need not be adjusted. For this purpose, the circuit arrangement according to the invention is characterised in that, in order to ensure that the high-voltage power switches are automatically cut off substantially simultaneously, the control means for each switch comprise a delay element for delaying the cut-off signal of the relevant switch. The circuit arrangement further comprises a comparison stage for comparing the voltage present in operation at the junction point between the switches with a reference voltage so as to control the delay caused by at least one delay element.

The invention is based on the recognition of the fact that the junction point of the switches can serve as a measuring point for providing useful information about the unequal storage times of the charge carriers in the switches. It should be noted in this connection that the switches can be constituted not only by transistors but also by other controllable switches which can be switched off non simultaneously under the influence of the same switching-off signal, for example, gate turn-off switches.

The circuit arrangement according to the invention can be characterized in that the comparison stage is a differential amplifier with a first input terminal connected to the junction point between the switches, a second input terminal connected to the reference voltage and an output terminal connected to the said delay element for controlling the delay caused by it as a function of the difference between the values at the input terminals.

The circuit arrangement according to the invention is preferably characterized in that the differential amplifier has a second output terminal connected to the second delay element for controlling the delay caused by it as a function of the difference between the values at the input terminals of the differential amplifiers. Due to this measure, the overall delay can be kept smaller.

Circuit protection is obtained when the circuit arrangement according to the invention is characterized in that the junction point between the high-voltage power switches is connected to a slicer for limiting the voltage present at this point during the cut-off time of the switches.

BRIEF DESCRIPTION OF THE DRAWING

The invention will be described, by way of example, with reference to the accompanying drawing in which FIG. 1 shows a principle circuit diagram of a circuit arrangement according to the invention, which forms part of a line deflection circuit arrangement of a picture display apparatus.

FIG. 2 shows wave forms occurring therein, and

FIG. 3 shows in greater detail a circuit diagram of the line deflection circuit arrangement of FIG. 1.

DESCRIPTION OF THE PREFERRED EMBODIMENT

In FIG. 1, reference L designates the line deflection coil for electromagnetically deflecting in the horizontal direction one or more electron beams produced in a picture display tube, not shown. A trace capacitor C is connected in series with this coil. The series-combinations of two npn switching transistors T1 and T2, of two diodes D1 and D2 and of two retrace capacitors C1 and C2 are connected in parallel with the arrangement obtained. The emitter of the transistor T1 is connected to the collector of the transistor T2 and the anode of the diode D1 is connected to the cathode of the diode D2. The junction point between the capacitors C1 and C2 is connected to the junction point between the transistors $T_1$ and $T_2$ and to that between the diodes D1 and D2. One end of an inductor L1 is connected to the junction point between the collector of the transistor T1, the cathode of the diode D1 and the capacitors C and C1, and one end of an inductor L2 is connected to the junction point between the emitter of the transistor T2, the anode of the diode D2, the capacitor C2 and of the coil L. The inductors L1 and L2 are each connected on the other hand to a respective terminal of a supply voltage source $V_B$. The negative terminal of the source $V_B$, which is connected to the inductor L2, may be connected to ground.

During a part (the trace time) of the line period, the switches constituted by the transistor T1 and the diode D1 and by the transistor T2 and the diode D2, respectively, are conducting. The coil L is connected to the voltage across the capacitor C and the saw-tooth line deflection current flows through the switches, first through the diodes and then through the transistors. Due to the symmetry of the circuit arrangement, the voltage at the junction point A between the switches is equal to half the supply voltage, i.e. $V_B/2$. The direct current component of the (trace) voltage across the capacitor C is equal to $V_B$.

The retrace is initiated at the instant at which the transistors T1 and T2 become cut off. During the retrace time, the inductors and the capacitors of the circuit arrangement constitute a resonant network. At the collector K of the transistor T1, the voltage increases according to substantially a cosine function above the value at the end of the trace time, i.e. $V_B/2$. In a corresponding manner, the voltage at the emitter E for the transistor T2 decreases according to substantially a cosine function below the value $V_B/2$. The retrace time is terminated at the instant at which both voltages, after having reached a positive maximum and a negative maximum, respectively, reassume the value $V_B/2$, as a result of which the diodes D1 and D2 become conductive. When the retrace time is short with respect to the line period, both retrace pulses have a high amplitude, which is many times higher than the voltage $V_B$. The amplitudes are both equal to half the retrace pulse which is produced in a line deflection circuit in which the trace voltage is $V_B$ and which is provided with only one switch.

The afore-mentioned uniform voltage distribution over the switches applies in the case in which C1 and C2 have equal capacitances and the switches T1, D1 and T2, D2 are simultaneously conducting and cut off, respectively. In general, however, the storage times of the charge carriers in the transistors are unequal, as a result of which the switch-off instants do not coincide even when the same control signal is used. When in FIG. 1 the transistor T1 is conducting for a longer time than the transistor T2, a retrace pulse is produced across the transistor T1 at a later instant than across the transistor T2. The amplitude of the first pulse is therefore smaller than the amplitude of the second pulse, the first pulse being terminated earlier than the second pulse.

Attempts can be made to improve the circuit arrangement by magnetically coupling the inductors L1 and L2 to each other, which is indicated in FIG. 1 by polarity dots. FIG. 2 shows the pulse which is present at the point K in the case where the transistor T1 is cut off at a later instant $t_2$ than the instant $t_1$ at which the transistor T2 is cut off. Before the instant $t_1$, the deflection current flows through the elements L, C, T1 and T2. Between the instants $t_1$ and $t_2$, this current flows in the same direction through the elements L, C, T1 and C2, while at the point K the voltage increases above the value $V_B/2$ according to a cosine function at a frequency determined *inter alia* by the capacitor C2. Because of the conducting transistor T1, the voltages at the points A and K are substantially equal. After the instant $t_2$, the current flowing through the coil L also flows through the capacitors C, C1 and C2 at a higher resonant frequency than before this instant. The pulse at the point K therefore has, after the instant $t_2$, a steeper slope than before it, while the point A retains the same value, which is higher than $V_B/2$, as before it. At the instant $t_3$ at which the voltage at the point K reaches this value again, the diode D1 becomes conducting, while the diode D2 becomes conducting at the instant $t_4$ at which the pulse at the point E, whose variation with respect to the value $V_B/2$ is symmetrical to that of the pulse at the point K due to the coupling between the inductors L1 and L2, reaches this value. Between the instants $t_3$ and $t_4$, the same tuning applies as between the instants $t_1$ and $t_2$. It appears from the foregoing that the maximum value of the voltage present across the transistor T1 during the retrace time, i.e. the difference between the voltages at the points K and A, is lower than the maximum value of the voltage present across the transistor T2 during the same time. When the transistor T2 conducts for a longer time than the transistor T1, the opposite applies of course, so that the voltage at the point A is lower than the value $V_B/2$. This effect is not negligible: at a voltage $V_B$ of 150 V and a retrace pulse in the balanced case of 600 V, for a time of 100 ns between the instants $t_1$ and $t_2$, a voltage is measured at A between the instants $t_2$ and $t_3$ of 100 V, which means that the retrace pulse across the transistor T1 has an amplitude of 500 V, while the retrace pulse across the transistor T2 has an amplitude of 700 V.

These retrace pulses will have equal amplitudes and the voltage at the point A will have substantially the constant value $V_B/2$ when this point is decoupled with respect to ground by means of a capacitor having a sufficiently high capacitance, while the inductors L1 and L2 are still coupled to each other. Between the instants $t_1$ and $t_2$, the current flowing through the coil L and the capacitor C also flows through the transistor T1 and the decoupling capacitor. This current originates from the inductor L2. When the coupling between the inductors L1 and L2 is equal to 1, a current having the same intensity as the current flowing through the inductor L2 flows through the inductor L1 from the source $V_B$. The current flowing through the inductor L1 also flows through the transistor T1. Immediately after the instant $t_1$, a current which is twice the current flowing through the transistors T1 and T2 immediately before the instant $t_1$ therefore flows through the transistor T1, and between the instants $t_1$ and $t_2$ the current through the transistor T1 continues to increase. This current peak can be very harmful.

It will be sufficiently apparent from the foregoing that both switches have to be switched off simultaneously. For this purpose, the signal produced by a line oscillator OSC is supplied according to FIG. 1 to a delay element Dy1 and to a delay element Dy2. After having been subjected to a delay in the element Dy1 and Dy2, respectively, the signal is supplied to a driver stage Dr1 and Dr2, respectively. The output signal of the stage Dr1 is the control signal for the base of the transistor T1, while the output signal of the stage Dr2 is the control signal for the base of the transistor T2. A comparison stage Cp has supplied to it information originating from the point A and a reference voltage $V_r$, while one of the delays caused by the elements Dy1 and Dy2 is controlled by the stage Cp. The stage Cp acts as a differential amplifier which amplifies the difference between the voltage present at the point A during the retrace time and the voltage $V_r$. The voltage $V_r$ has the value $V_B/2$ of the voltage present at the point A during the trace time. Due to the effect of the control loop obtained, the control signal of the transistors T1 and T2 high amplification of the control loop. One voltage is, for example, 3 V and the other 5 V.

It appears from the foregoing that the transistors T4 and T5 and the associated components constitute the comparison stage, while the network R1, D3, C4 and the amplifiers AMP1 and AMP2 constitute the delay elements. When the resistor R7 is not connected to the point K, but to the source $V_B$, the comparison stage is constantly operative so that the voltage measured at the point A is not the voltage present during the retrace time, but the mean value thereof over the whole line period, which is proportinal thereto. In this case, this mean value may serve as a reference voltage. For this purpose, the resistors R2 and R3 are replaced by a resistor between the point A and the base of the transistor T4 and a capacitor between this base and ground. If the inductor L2 is dispensed with, the point E thus being directly connected to the junction point of the transistor T3 and the capacitor C3, a positive-going retrace pulse is present at the point A. The amplitude of this pulse in the target case is half that of the pulse present at the point K. In this case, the reference voltage for the comparison stage must be such a pulse having half the amplitude. It is then more practical to connect a peak rectifier between the point A and the comparison stage, the reference voltage being equal to the peak value of the pulse having half the amplitude. In all these and similar cases, the choice of the reference voltage is now determined by the choice made for the circuit arrangement.

The circuit arrangement shown in FIG. 3 further comprises a protection device in the form of a slicer having two diodes D4 and D5, the anode of the diode D4 and the cathode of the diode D5 being connected to the point A and the cathode of the diode D4 being connected to the positive terminal of the source $V_B$ and the anode of the diode D5 to the junction point of the elements L2, T3 and C3. If the storage times of the transistors T1 and T2 are very different, the voltage at the point A could become dangerously high or low when the picture display apparatus is switched on, that is to say at an instant at which the control loop is not yet operative. The diode D4 ensures that this voltage cannot become higher than $V_B$, which provides a protection for the transistor T2, while the diode D5 ensures that this voltage cannot become lower than the voltage present at the collector of the transistor T3, which provides a protection for the transistor T1. During the trace time, the diodes D4 and D5 are cut off.

Circuit arrangements have been described above in which two switches are connected to a high voltage. It should be appreciated that similar circuit arrangements may be provided with three or more switches. The control lead of one of these switches may then comprise a delay element with a fixed delay, whereas the control leads of the remaining switches comprise delay elements with adjustable delays. These delays are controlled in that the voltage at the junction point of two switches is compared with the target value thereof.

It should finally be noted that the circuit arrangement according to the invention may also be used in arrangements other than line deflection circuit arrangements, that is to say on those occasions when a controllable switch is connected to an excessively high voltage.

What is claimed is:

1. A circuit arrangement comprising at least two high-voltage power switches connected in series and having control means for repeatedly cutting off the switches, said control means being connected to a signal source for producing a control signal for the switches, characterized in that, in order to ensure that the high-voltage power switches are automatically cut off substantially simultaneously, the control means for each switch comprise a delay element for delaying a cut-off signal of the said switch, the circuit arrangement further comprising a comparison stage for comparing a voltage present in operation at a junction point between the switches with a reference voltage and for controlling the delay caused by at least one delay element.

2. A circuit arrangement as claimed in claim 1, wherein the comparison stage comprises a differential amplifier having a first input terminal connected to the junction point between the switches, a second input terminal connected to the reference voltage and an output terminal connected to the said delay element for controlling the delay thereof as a function of the difference between the voltages at the input terminals.

3. A circuit arrangement as claimed in claim 2, wherein the differential amplifier includes a second output terminal connected to the second delay element for controlling the delay thereof as a function of the difference between the voltages at the input terminals of the differential amplifier.

4. A circuit arrangement as claimed in claim 2, wherein the differential amplifier is operative during the cut-off time of the high-voltage power switches and is inoperative during the conduction time thereof.

5. A circuit arrangement as claimed in claim 1, wherein the delay element comprises a pulse edge shift circuit for shifting a blocking edge in the control signal of the said switch as a function of an output signal of the comparison stage.

6. A circuit arrangement as claimed in claim 1, wherein the junction point between the high-voltage power switches is connected to a slicer for limiting the voltage present at said junction point during the cut-off time of the switches.

7. A circuit arrangement as claimed in claim 3 wherein the differential amplifier is operative during the cut-off time of the high voltage power switches and is inoperative during the conduction time thereof.

8. A switching circuit comprising: a pair of terminals for connection to a source of high voltage, first and second high voltage semiconductor switches connected in series between said pair of terminals, control means for supplying a periodic switching control signal to respective control electrodes of the first and second semiconductor switches to drive the first and second switches from a saturation state to a cut-off state, said control means including first and second delay elements coupled to the control electrodes of the first and second semiconductor switches, respectively, for delaying a cut-off control signal supplied to the respective control electrodes, a comparison device having a first input coupled to a junction point between the first and second semiconductor switches and a second input coupled to a source of reference voltage, means coupling an output of the comparison device to at least one of said first and second delay elements for controlling the delay time of said one delay element as a function of the voltages appearing at said first and second inputs of the comparison device and in a manner so as to substantially simultaneously drive the first and second semiconductor switches from said saturation state to said cut-off state.

9. A switching circuit as claimed in claim 8 wherein the comparison device comprises a second output terminal coupled to the other one of said delay elements is delayed by the elements Dy1 and Dy2 in a manner such that the amplitude of the pulse represented in FIG. 2 between the instants $t_1$ and $t_4$ is substantially zero at the point A. This means that a negative-going edge of a pulse in the oscillator signal is generally subjected to unequal delays, which results in the transistors T1 and T2 becoming non-conducting substantially simultaneously and consequently in the diodes D1 and D2 becoming conducting also simultaneously. The sum of the delay and the storage time for one transistor is equal to the corresponding sum for the other transistor.

In the circuit arrangement shown in FIG. 1, the inductors L1 and L2 are coupled to each other. Because the switches T1, D1 and T2, D2 are switched on and off simultaneously due to the control described, it should be appreciated that this coupling is not absolutely necessary. However, it is necessary that the point A, which serves as a measuring point for the asymmetry, is not decoupled. It should also be appreciated that it may be more practical to control both delays instead of only one delay. This is illustrated in FIG. 1. In this manner, the overall delay can be kept smaller. It should further be noted that the position of the delay element in the control lead of the transistor T1 and T2, respectively, is only of practical importance, that is to say that the element Dy1 and the stage Dr1 and the element Dy2 and the stage Dr2 can be interchanged. This is the case if the elements Dy1 and Dy2 are in the form of transductors, whose self-inductances are adjusted by means of the stage Cp. As has been described the comparison stage is a keyed amplifier, which is operative only during the retrace time for measuring the difference between the voltage then present at the point A and the target value thereof, but it should be noted that the mean value over the whole period of the voltage at the point A is also useful information so that the stage Cp can be operative continuously, although the amplification of the stage Cp then has to be larger than in the other case. When two supply voltages, a positive one and a negative one, having the same absolute values, are available, the end of the inductor L2 not connected to the point E may advantageously be connected to the negative supply voltage. The target value of the voltage at the point A is then zero, as is the voltage $V_r$.

The circuit arrangement of FIG. 3 is a line deflection circuit which is intended for use in a picture display apparatus for displaying digitally produced characters and pictures, the line frequency being about 64 kHz. In FIG. 3, the elements corresponding to those in FIG. 1 are designated by the same reference numerals. The end of the inductor L2 remote from the point E is not connected to ground, but is connected to the collector of a transistor T3, whose emitter is connected to ground and to the base of which is supplied a signal of field frequency. By means of the transistor T3, whose collector is decoupled by means of a capacitor C3 for the line frequency, a voltage source varying at the field frequency is connected in series with the source $V_B$ for correcting the field distortion. The deflection circuit comprises other known elements, which are not shown for the sake of simplicity. A centering device is such an element.

The line oscillator OSC used is an integrated circuit of PHILIPS type TDA 2593, in which further the synchronization signal and line retrace pulses originating from the point K takes place. The output signal of the oscillator OSC is distorted by a network comprising a series resistor R1 and a diode D3 connected in parallel therewith as well as a capacitor C4 which is connected on the other hand to ground. This network ensures that an abruptly ascending edge of a pulse is rounded off, whereas the succeeding descending edge remains undistorted. The pulse obtained is supplied to the non-inverting input terminal of an amplifier AMP1 and to the non-inverting input terminal of an amplifier AMP2. Both amplifiers form part of an integrated circuit of Signetics type LM 393. The inverting terminal of the amplifier AMP1 is connected to the collector of a pnp-transistor T4 and to a capacitor C5, while the inverting terminal of the amplifier AMP2 is connected to the collector of a pnp-transistor T5 and to a capacitor C6. The two said inverting terminals are further connected through resistors of high value to ground and to a positive voltage, as a result of which a pre-adjustment for limiting the control range is obtained. The output signal of the amplifier AMP1 controls the base of a pnp driver transistor T6, which supplies through a driver transformer a control signal to the transistor T1. In a similar manner, the output signal of the amplifier AMP2 controls the base of an npn-driver transistor T7 which supplies through a driver transformer a control signal to the transistor T2. The supply for the transistors T6 and T7, respectively, is ensured by a pnp-transistors T8 and T9, respectively, acting as a current source, so that a satisfactory operation of the control is obtained when the voltage $V_B$ gradually increases after the picture display apparatus is switched on.

The transistors T4 and T5 constitute a differential amplifier. The base of the transistor T4 is connected to the reference voltage which is obtained by means of two resistors R1 and R3 of substantially equal value. The resistor R2 is connected on the other hand to the voltage $V_B$ and the resistor R3 is connected on the other hand to the junction point of the elements L2, T3 and C3. The base of the transistor T5 is connected through a resistor R4 to the point A. The value of the resistor R4 is about half that of the resistor R2 or R3. The emitters of the transistors T4 and T5 are connected to each other through resistors R5 and R6. In operation, these transistors are rendered conducting through a resistor R7 by the retrace pulses occurring at the point K. When the voltage at the point A is equal to the reference voltage, the voltages at the collectors of the transistors T4 and T5 are both equal to, for example, 4 V. The amplifiers AMP1 and AMP2 amplify the part of the pulse supplied thereto which is higher than 4 V. The leading edges of the pulses applied to the transistors T6 and T7 and therefore of the control pulses of the transistors T1 and T2 thus occur simultaneously. If the transistors T1 and T2 have unequal storage times, these transistors will not be switched off simultaneously, as a result of which a pulse is obtained at the point A during the retrace time.

Consequently, one of the transistors T4 and T5 conducts to a larger and the other to a smaller extent, as a result of which one of the capacitors C5 and C6 receives a larger amount of charge. The voltage at one inverting terminal increases above 4 V, whereas the voltage at the other inverting terminal decreases below 4 V. The blocking edges of the control pulses of the transistors T1 and T2 and therefore shifted with respect to the balanced case; one occurs earlier and the other later. This happens already after a few line periods. In the final state the voltage at the point A deviates very slightly from the value $V_B/2$, while the voltages across the capacitors C5 and C6 deviate from 4 V due to the for controlling the delay time thereof as a function of the voltages appearing at said first and second inputs of the comparison device.

10. A switching circuit as claimed in claim 8 further comprising means coupled to said comparison device for inhibiting the operation thereof during the conduction time of the first and second semiconductor switches whereby the comparison device is only operative during the cut-off time of said first and second semiconductor switches.

11. A switching circuit as claimed in claim 8 further comprising a slicer coupled to the junction point between the first and second semiconductor switches for limiting the voltage present at said junction point during the cut-off time of said semiconductor switches.

12. A switching circuit as claimed in claim 11 wherein the slicer comprises, first and second diodes series connected to said pair of terminals with a junction point therebetween connected to said junction point between the first and second semiconductor switches.

13. A switching circuit as claimed in claim 8 wherein the first and second semiconductor switches comprise first and second transistors of the same conductivity type, said switching circuit being operative to develop a voltage at said junction point that is representative of the difference in storage times of the charge carriers in the first and second transistors.

14. A switching circuit as claimed in claim 8 further comprising: a first inductor connected between an output electrode of the first semiconductor switch and a first one of said pair of terminals, and a second inductor connected between an output electrode of the second semiconductor switch and a second one of said pair of terminals, said first and second inductors being inductively coupled to one another.

15. A switching circuit as claimed in claim 14 further comprising: first and second diodes connected in antiparallel with said first and second semiconductor switches, respectively, first and second capacitors connected in parallel with said first and second diodes, respectively, and means for coupling a load inductor to the output electrodes of said first and second semiconductor switches.

16. A switching circuit as claimed in claim 15 wherein said load inductor comprises a line deflection coil of a television receiver, and a third capacitor connected in series with said line deflection coil to said output electrodes of the first and second semiconductor switches.

17. A switching circuit as claimed in claim 8 wherein said control means includes an oscillator for deriving a periodic pulsatory type control signal for the first and second semiconductor switches, and said delay elements include a network for shaping the periodic pulsatory control signal from the oscillator to produce a pulsatory control signal with a rounded leading edge and a sharp trailing edge.

18. A switching circuit as claimed in claim 8 further comprising, first and second transformers for coupling said control signal to the control electrodes of the first and second semiconductor switches, first and second drive transistors coupled to respective primary windings of the first and second transformers respectively, and first and second current sources coupling said first and second drive transistors, respectively, to said pair of input terminals.

19. A switching circuit as claimed in claim 8 wherein said first and second semiconductor switches comprise first and second NPN transistors with the emitter of the first transistor directly connected to the collector of the second transistor to form said junction point.

20. A switching circuit as claimed in claim 8 wherein said pair of input terminals are adapted to be coupled to a source of DC voltage of a value $V_B$, and wherein said source of reference voltage has a voltage value of $V_B/2$.

* * * * *

UNITED STATES PATENT AND TRADEMARK OFFICE
CERTIFICATE OF CORRECTION

PATENT NO. : 4,540,933

DATED : September 10, 1985

INVENTOR(S) : DIRK J.A. TEULING

It is certified that error appears in the above-identified patent and that said Letters Patent is hereby corrected as shown below:

In the Specification:

Column 5, line 64, after "the" insert
--synchronization between an incoming line--

Signed and Sealed this

Ninth Day of December, 1986

Attest:

DONALD J. QUIGG

Attesting Officer

Commissioner of Patents and Trademarks